United States Patent
Yamamoto

(10) Patent No.: US 6,690,212 B2
(45) Date of Patent: Feb. 10, 2004

(54) INDUCTIVE LOAD DRIVING CIRCUIT

(75) Inventor: Seiichi Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 24 days.

(21) Appl. No.: 10/183,186

(22) Filed: Jun. 25, 2002

(65) Prior Publication Data

US 2002/0163366 A1 Nov. 7, 2002

Related U.S. Application Data

(62) Division of application No. 09/656,405, filed on Sep. 6, 2000, now Pat. No. 6,441,654.

(30) Foreign Application Priority Data

Sep. 8, 1999 (JP) ............................................ 11-253760

(51) Int. Cl.⁷ .............................. H03B 1/00; H03K 3/00
(52) U.S. Cl. ........................ 327/110; 327/424; 327/588
(58) Field of Search ........................ 327/108–112, 139, 327/423, 424, 448, 588, 427, 436, 478, 482, 434; 326/82, 83; 257/484, 544, 372

(56) References Cited

U.S. PATENT DOCUMENTS

| | | | | |
|---|---|---|---|---|
| 4,647,956 A | * | 3/1987 | Shrivastava et al. | 257/373 |
| 4,905,067 A | | 2/1990 | Morelli et al. | 257/547 |
| 4,918,026 A | * | 4/1990 | Kosiak et al. | 438/207 |
| 5,057,720 A | | 10/1991 | Hattori | 327/424 |
| 5,095,224 A | * | 3/1992 | Renger | 327/110 |
| 5,377,094 A | | 12/1994 | Williams et al. | 327/110 |
| 5,469,095 A | | 11/1995 | Peppiette et al. | 327/110 |
| 5,753,964 A | | 5/1998 | Yashita et al. | 257/547 |
| 5,892,268 A | | 4/1999 | Yashita et al. | 327/110 |
| 5,925,910 A | | 7/1999 | Menegoli | 257/335 |
| 6,147,545 A | | 11/2000 | Marshall | 327/424 |
| 6,172,550 B1 | * | 1/2001 | Gold et al. | 327/110 |
| 6,282,044 B1 | | 8/2001 | Teterud et al. | 327/110 |
| 6,396,102 B1 | * | 5/2002 | Calafut | 257/331 |
| 6,441,654 B1 | * | 8/2002 | Yamamoto | 327/110 |

* cited by examiner

Primary Examiner—Long Nguyen
(74) Attorney, Agent, or Firm—Hogan & Hartson LLP

(57) ABSTRACT

An inductive load driving circuit includes a switching transistor and a guardring. The switching transistor is connected between an output terminal and a power supply potential point. The guardring is an N-type semiconductor region provided for the switching transistor and connected to the power supply potential point.

6 Claims, 6 Drawing Sheets (Prior Art)

INDUCTIVE LOAD DRIVING CIRCUIT

This is a divisional of application Ser. No. 09/656,405 filed Sep. 6, 2000 now U.S. Pat. No. 6,441,654, which application is hereby incorporated by reference in its entirety.

FIELD OF THE INVENTION

The present invention relates to an inductive load driving circuit that drives inductive load, using switching elements that are formed in an integrated circuit device.

BACKGROUND OF THE INVENTION

A disk media apparatus, such as a CD, CD-ROM, DVD and MD, is provided with an inductive load, such as, an actuator and a motor. The load is driven by a load driving circuit that uses semiconductor switching devices as control devices, such as MOSFETs (insulation gate field effect transistors), bipolar transistors and the like.

FIGS. 1A and 1B show a conventional inductive load driving circuit that has generally been used, which is formed in an integrated circuit device.

Referring to FIG. 1, load driving MOSFETs Q1 through Q4 that are N-channel type and a load L are formed in a bridge circuit. A control circuit 11 provides a driving signal 12 that is composed of a PWM (pulse width modulation) control signal and forward and inverse direction control signals to thereby control the driving circuit.

When the load L is driven in a forward direction, the MOSFET Q1 is controlled to be conductive by the PWM control signal, and the MOSFET Q4 is controlled to be conductive by the forward direction control signal, such that a load current in a forward direction flows through the load L. Inversely, when the load L is driven in an inverse direction, the MOSFET Q2 is controlled to be conductive by the PWM control signal, and the MOSFET Q3 is controlled to be conductive by the inverse direction control signal, such that a load current in an inverse direction flows through the load L.

FIG. 1 shows the case when the load L is driven in an inverse direction. In this case, the MOSFET Q3 is turned on by the inverse direction control signal, and the MOSFET Q2 is turned on and off by the PWM control signal. In this instance, the MOSFET Q1 and the MOSFET Q4 are turned off.

When the MOSFET Q2 is turned on by the PWM control signal, and driven simultaneously with the MOSFET Q3, a load current Io in an inverse direction (shown in a dot-and-dash line in FIG. 1) flows through the load L, in a direction from a power supply potential point Vcc to a ground potential point GND, as shown in FIG. 1A.

On the other hand, when the MOSFET Q2 is turned off by the PWM control signal, only the MOSFET Q3 turns on, as shown in FIG. 1B. As described above, the MOSFET Q4 is an N-channel type. Therefore, when the MOSFET Q4 is in an OFF state, a current path is formed by a parasitic diode that is formed by a back gate BG connected to a source S, a P-type substrate and an N-type drain D, and a current could flow through.

Since the load L is an inductive load such as a motor and an actuator, a load current Io circulates through a path that is formed by the load L, drain and source of the MOSFET Q3, the source S, the back gate BG and the drain D of the MOSFET Q4 (namely, a parasitic diode), as shown by a dot-and-dash line in the figure, by an inductive electromotive force by the accumulated energy of the inductive load L.

As a result, when the MOSFET Q2 is turned on and off by the PWM control signal, the load current Io continuously flows in accordance the duty ratio of the PWM control signal.

At this moment, a parasitic NPN-type bipolar transistor is formed in the integrated circuit device in which the inductive load driving circuit is formed. The parasitic NPN-type bipolar transistor has a base that is an anode side (i.e., the back gate BG of the MOSFET Q4) of the parasitic diode and an emitter that is a cathode side (i.e., the drain D of the MOSFET Q4) of the parasitic diode. The parasitic NPN-type bipolar transistor draws a current from an N-type semiconductor that is formed in another region depending on the direct current amplification coefficient hfe of the parasitic NPN-type bipolar transistor.

Normally, when the parasitic transistor draws a current from an N-type semiconductor of an element that forms another circuit, the circuit is possibly malfunctioned. Therefore, an N-type semiconductor guardring is disposed around the switching transistor (in this case, the MOSFETs Q4 and Q3). The N-type semiconductor guardring is connected to a stable high potential such as the power supply potential point Vcc to thereby supply a current to the parasitic transistor and reduce effects by the parasitic transistor on the other circuit outside the guardring.

However, when the parasitic NPN-type bipolar transistor is turned on, power is consumed not only between the base and the emitter of the parasitic NPN-type bipolar transistor, but also between the collector and the emitter thereof. Since the collector is connected to a high potential of the power supply potential point Vcc, a large loss is generated by the collector current. Also, with a higher switching frequency of the PWM control, the loss becomes greater. Such a loss cannot be neglected.

SUMMARY OF THE INVENTION

An inductive load driving circuit is formed in an integrated circuit device having a first switching transistor, a second switching transistor, and a guardring. The first switching transistor is connected between a first power supply potential point and an output terminal. The second switching transistor is connected between the output terminal and a second power supply potential point. The first switching transistor and the second switching transistor are controllably turned on and off, to thereby supply an adjusted power to an inductive load that is connected between the output terminal and the second power supply potential point. A guardring of an N-type semiconductor region is provided for the second switching transistor. The guardring is connected to the second power supply potential point.

In the inductive load driving circuit, the second switching transistor may be an N-channel MOSFET having a back gate region and a drain region where the N-channel MOSFET is formed in a P-type semiconductor substrate. Also, the second switching transistor may be an N-channel DMOSFET having a drain region where the N-channel DMOSFET is formed in an N-type diffusion layer provided in a type semiconductor substrate. In addition, the second switching transistor may be an NPN-type bipolar transistor formed in an N-type diffusion layer provided in a type semiconductor substrate.

In this manner, the circuit has the first and the second switching transistors that are connected between the first power supply potential point and the second power supply potential point, and controllably turned on and off to drive the inductive load. The circuit is provided with the guardring that prevents effects on other elements formed on the same semiconductor substrate, and the guardring is connected to the second power supply potential point. By this structure, a load current in an inverse direction flows via a parasitic diode of the second switching transistor that is provided on the side of the ground and is in an off state. Other effects similar to those described above are also achieved.

DETAILED DESCRIPTION OF PREFERRED EMBODIMENTS

Figure 2:
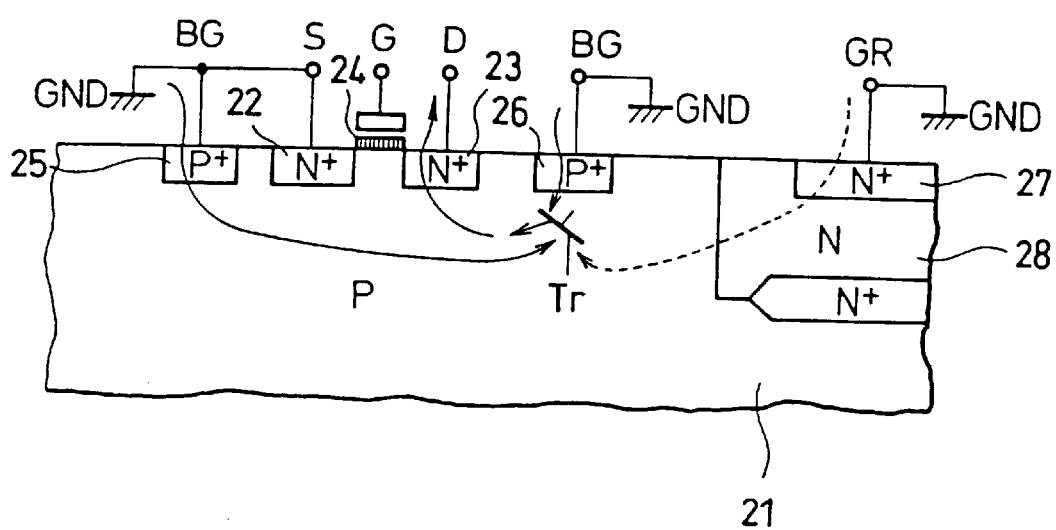
FIG. 2 is a cross-sectional view of a semiconductor substrate having an inductive load driving circuit in accordance with a first embodiment of the present invention.

FIG. 2 is a partial cross-sectional view of a semiconductor substrate having an inductive load driving circuit in accordance with a first embodiment of the present invention. In this embodiment, a MOSFET is used as a switching device.

It is noted that, in accordance with the present invention, an inductive load can be any element that presents inductivity in view of an output terminal of a load driving circuit. For example, an inductive load includes a resistor load with an added reactor, which presents inductivity as a whole.

Referring to FIG. 2, an $N^+$-type source region 22, an $N^+$-type drain region 23, and $P^+$-type back gate regions 25 and 26 are formed in a P-type semiconductor substrate 21. The source region 22 connects through a source terminal S to a ground potential point GND. The back gate regions 25 and 26 connect through back gate terminals BG to the ground potential point GND. The drain region 23 connects through a drain terminal D to an external element. A gate electrode is provided between the source region 22 and the drain region 23 through an oxide film dielectric member 24. The gate electrode connects through a gate terminal G to an external element. With the structure described above, an N-channel type MOSFET is formed.

An N-type diffusion layer 28 is formed in the P-type semiconductor substrate 21, and a guardring 27 of an $N^+$-type semiconductor is formed in the N-type diffusion layer 28 between the N-channel MOSFET and other elements in a manner that the guardring encircles the N-channel MOSFET. The guardring 27 is connected through a guardring terminal GR to an external element. In accordance with the present invention, the guardring terminal GR is connected to the ground potential point GND.

The inductive load driving circuit of the first embodiment has a circuit similar to the one shown in FIG. 1. Referring back to FIG. 1, the N-channel MOSFET formed in the P-type semiconductor substrate 21 of FIG. 2 corresponds to the load-driving MOSFET Q4 (or load-driving MOSFET Q3) of FIG. 1.

Figure 1A:
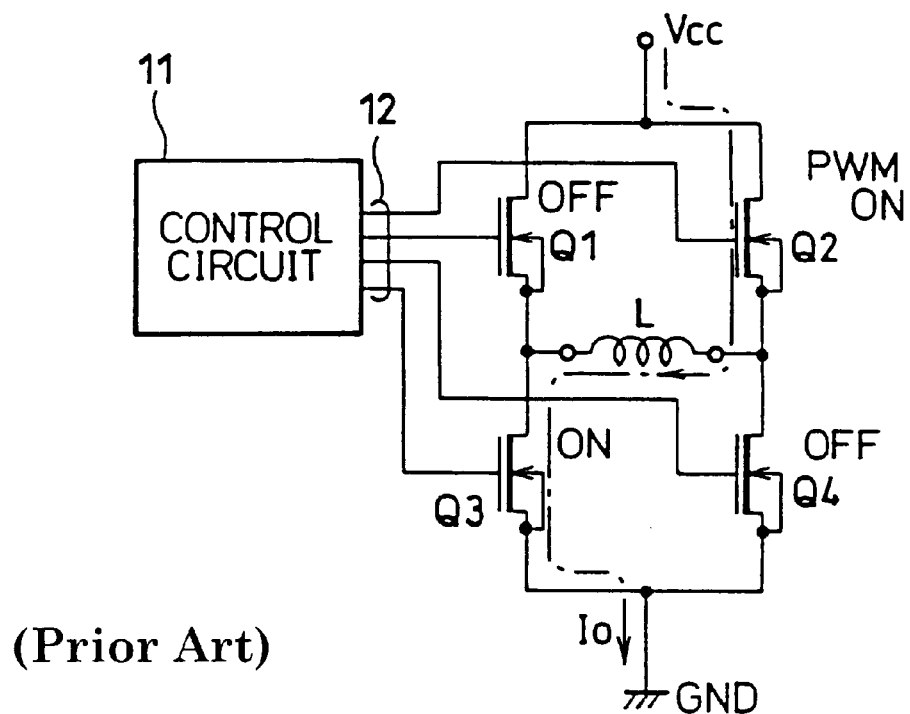
FIGS. 1A and 1B show a typical conventional inductive load driving circuit.

As shown in FIG. 1A, the load-driving MOSFET Q2 and the load-driving MOSFET Q3 are simultaneously driven, such that a load current Io in an inverse direction (indicated by a dot-and-dash line in FIG. 1) flows through the load L. When the PWM control signal is turned off, only the MOSFET Q3 is turned on, and the other MOSFETs Q1, Q2 and Q4 are turned off, as shown in FIG. 1B.

Figure 1B:
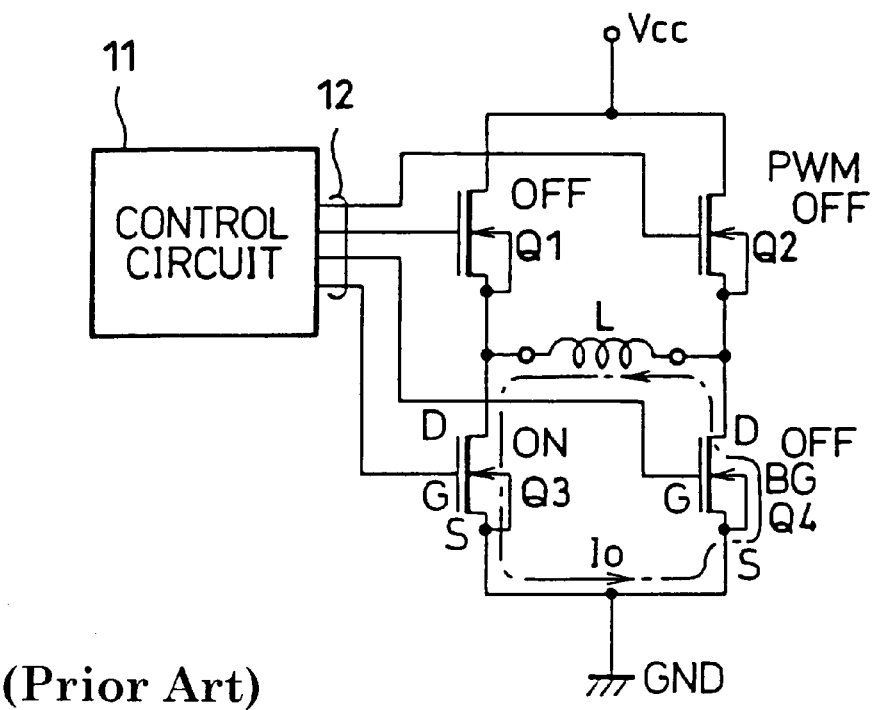

In this state, a load current circulates through a path formed by the load L, the drain and the source of the MOSFET Q3, the back gate BG and the drain D of the MOSFET Q4 (i.e., a parasitic diode) by an inductive electromotive force by the accumulated energy of the inductive load L, as indicated by a dot-and-dash line in FIG. 1B.

At this moment, in the integrated circuit shown in FIG. 2 in which the inductive load driving circuit is formed, an anode of the parasitic diode that corresponds to the back gate regions 25 and 26 of the MOSFET Q4 is at the ground potential point GND, but a cathode of the parasitic diode that corresponds to the drain region 23 is drawn to a negative potential. As a result, a parasitic NPN-type bipolar transistor Tr is formed with the back gate regions 25 and 26 of the MOSFET Q4 being as its base, the drain region 23 of the MOSFET Q4 as its emitter, and an N-type region of another element as its collector.

In order to prevent malfunctions of the other circuit by the current of the parasitic NPN-type bipolar transistor Tr, the guardring 27 of an N-type semiconductor is provided around the load-driving MOSFET Q4, such that the guardring functions as a collector of the parasitic NPN-type bipolar transistor Tr. The guardring terminal GR that externally leads the guardring 27 is connected to the ground potential point GND.

As a result, even when the parasitic NPN-type bipolar transistor Tr is formed in the load-driving MOSFET Q4 (or the load-driving MOSFET Q3), a voltage between the collector and the emitter of the parasitic NPN-type bipolar transistor becomes very small compared with the conventional technique in which the guardring is connected to a power supply potential point Vcc.

Accordingly, although a power loss takes place between the base and the emitter of the parasitic NPN-type bipolar transistor Tr, the power loss between the collector and the emitter of the parasitic NPN-type bipolar transistor, that is a major part of the entire power loss, is substantially reduced.

Furthermore, since the guardring of an N-type semiconductor is provided around the switching transistor, namely, the load-driving MOSFET Q4 (or the load-driving MOSFET Q3), and the guardring is connected to the stable ground potential point GND, effects on the other circuits outside the guardring is reduced in a similar manner as the conventional technique.

Figure 3:
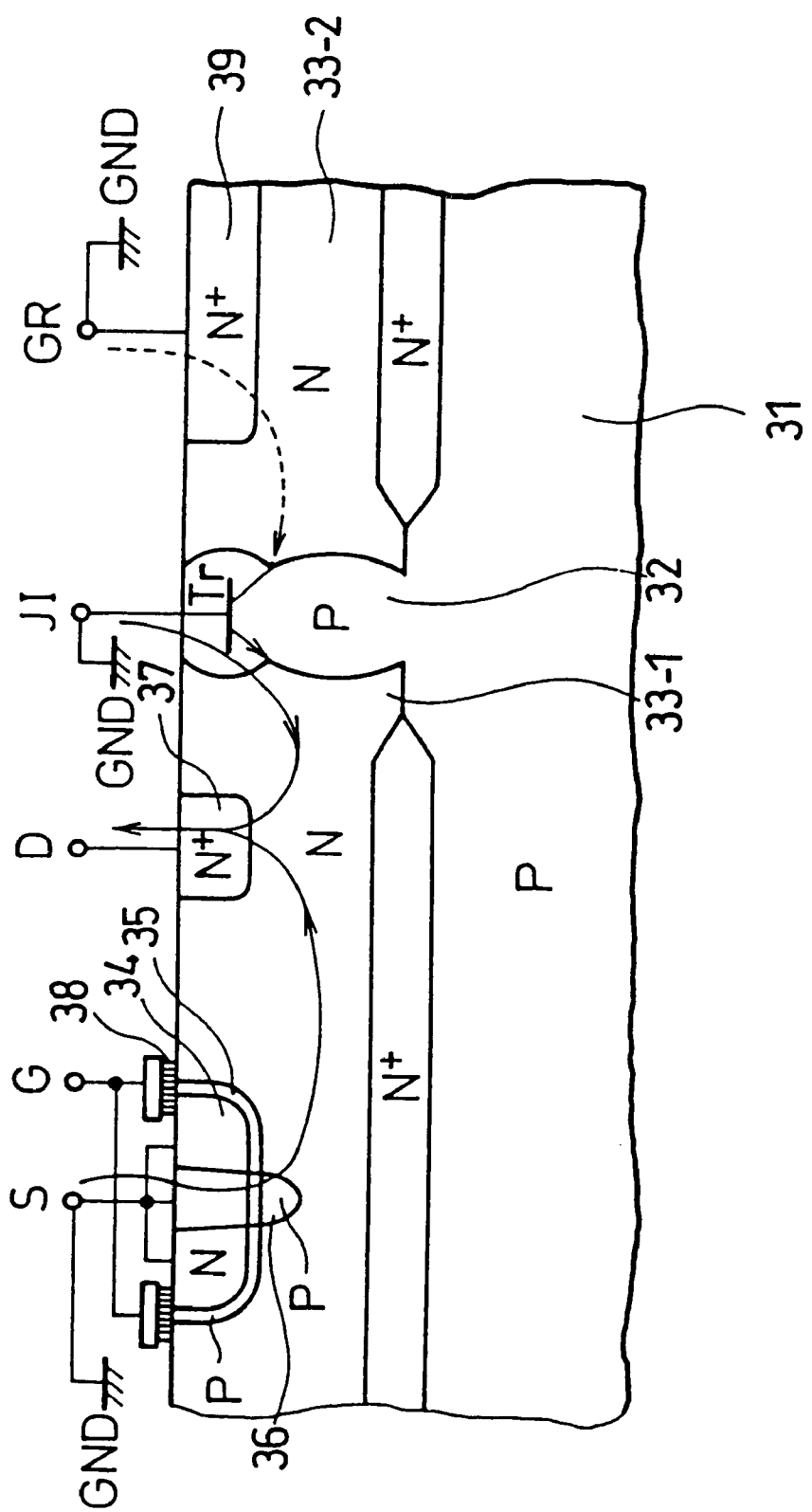
FIG. 3 is a cross-sectional view of a semiconductor substrate having an inductive load driving circuit in accordance with a second embodiment of the present invention.

FIG. 3 is a cross-sectional view in part of a semiconductor substrate having an inductive load driving circuit in accordance with a second embodiment of the present invention. In this embodiment, a DMOSFET (double diffusion MOSFET) is used as a switching device.

Referring to FIG. 3, an N-type diffusion layer 33-1 and an N-type diffusion layer 33-2 separated by a P-type isolation region 32 are formed in a P-type semiconductor substrate 31. By a double-diffusion, a P-type back gate region 35 that becomes a conductive channel is formed in the N-type diffusion layer 33-1, and an N-type source region 34 is formed in the back gate region 35. Furthermore, a P-type back gate connection region 36 that passes through the source region 34 and the back gate region 35 is formed. The back gate connection region 36 sets the back gate region 35 at a specified potential. Also, an $N^+$-type drain region 37 is formed in the N-type diffusion layer 33-1. The source region 34 and the back gate connection region 36 are connected through a source terminal S to a ground potential point GND. The drain region 37 is connected through a drain terminal D to an external element. A gate electrode is provided over the back gate region 35 through an oxide film insulation member 38, and the gate electrode is connected to an external element through a gate terminal G. Also, the P-type isolation region 32 is connected through an isolation terminal JI to the ground potential point GND. With the structure described above, an N-channel type DMOSFET is formed.

The inductive load driving circuit of the second embodiment has a circuit similar to the one shown in FIG. 1. Referring back to FIG. 1, the N-channel type DMOSFET formed in the P-type semiconductor substrate 31 of FIG. 3 corresponds to the load-driving DMOSFET Q4 (or load-driving DMOSFET Q3) of FIG. 1.

As shown in FIG. 1A, the load-driving DMOSFET Q2 and the load-driving DMOSFET Q3 are simultaneously driven, such that a load current Io in an inverse direction (indicated by a dot-and-dash line in FIG. 1) flows through the load L. When the PWM control signal is turned off, only the load-driving DMOSFET Q3 is turned on, and the other load-driving DMOSFETs Q1, Q2 and Q4 turn off, as shown in FIG. 1B.

In this state, a load current circulates through a path formed by the load L, the drain and the source of the DMOSFET Q3, the back gate BG and the drain D of the DMOSFET Q4 (i.e., a parasitic diode) by an inductive electromotive force by the accumulated energy of the inductive load L, as indicated by a dot-and-dash line in FIG. 1B.

At this moment, referring to FIG. 3, in the integrated circuit in which the inductive load driving circuit is formed, an anode of the parasitic diode that corresponds to the back gate connection region 36 and the P-type isolation region 32 of the DMOSFET Q4 are at the ground potential point GND, but a cathode of the parasitic diode that corresponds to the drain region 37 is drawn to a negative potential. As a result, a parasitic NPN-type bipolar transistor Tr is formed with the back gate connection region 36 and the P-type isolation region 32 of the DMOSFET Q4 being as its base, the drain region 37 of the DMOSFET Q4 as its emitter, and an N-type region of another element as its collector.

In order to prevent malfunctions of the other circuit by the current of the parasitic NPN-type bipolar transistor Tr, the guardring 39 of an N⁺-type semiconductor is provided in the N-type diffusion layer 33-2 around the P-type isolation region 32, such that the guardring functions as a collector of the parasitic NPN-type bipolar transistor Tr. The guardring terminal GR that externally leads the guardring 39 is connected to the ground potential point GND.

As a result, even when the parasitic NPN-type bipolar transistor Tr is formed in the load-driving DMOSFET Q4 (or the load-driving DMOSFET Q3), a voltage between the collector and the emitter of the parasitic NPN-type bipolar transistor Tr becomes very small compared with the conventional technique in which the guardring is connected to a power supply potential point Vcc.

Accordingly, the power loss is substantially reduced in a similar manner as the first embodiment.

Figure 4A:
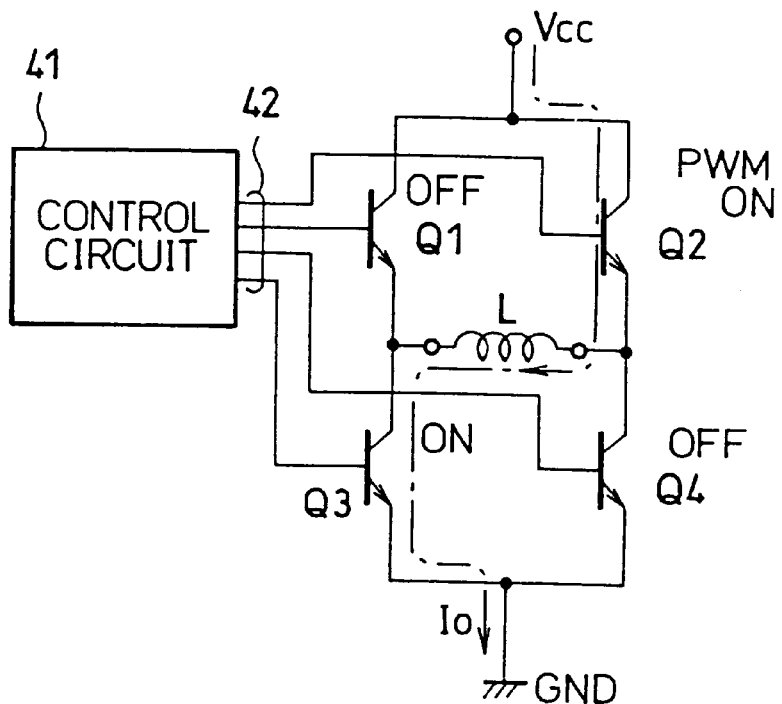
FIGS. 4A and 4B show an inductive load driving circuit in accordance with a third embodiment of the present invention.
Figure 4B:
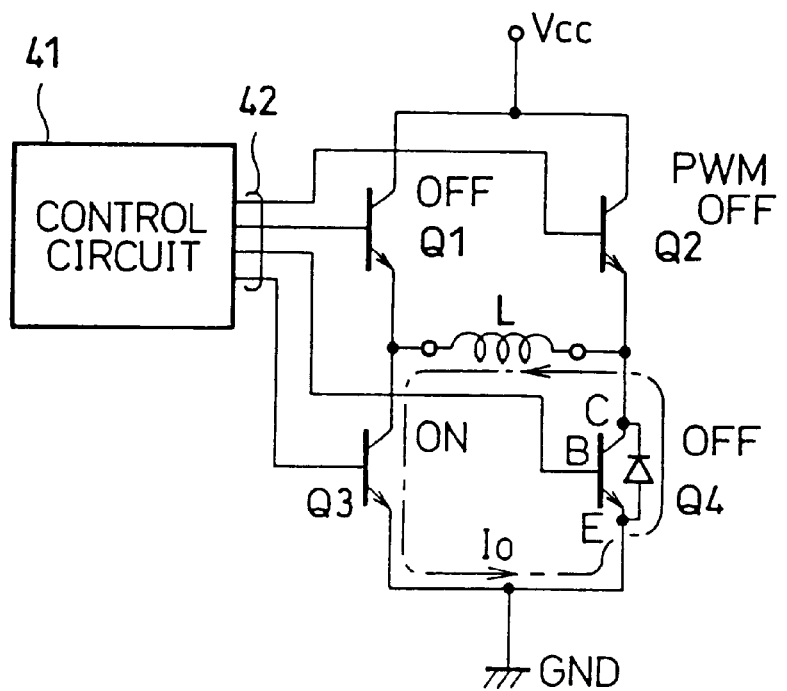
Figure 5:
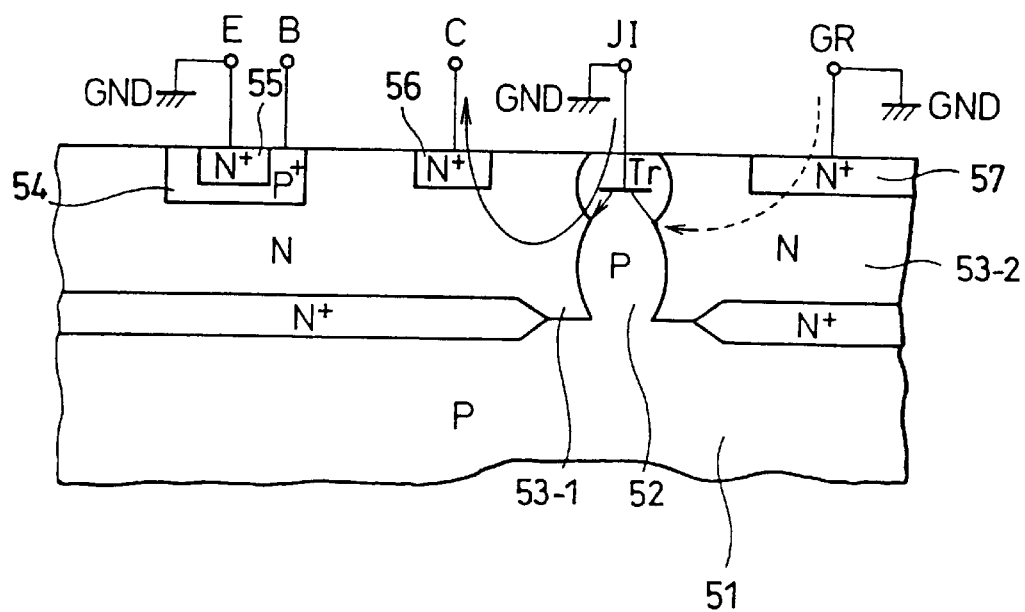
FIG. 5 is a cross-sectional view of a semiconductor substrate having an inductive load driving circuit in accordance with the third embodiment of the present invention.

FIGS. 4A and 4B show an inductive load driving circuit in accordance with a third embodiment of the present invention, and FIG. 5 is a cross-sectional view in part of a semiconductor substrate having the inductive load driving circuit implemented therein.

The inductive load driving circuit shown in FIGS. 4A and 4B has load-driving NPN-type bipolar transistors Q1 through Q4 and a load L that are formed in a bridge circuit. A control circuit 41 provides a driving signal 42 composed of a PWM control signal and forward and inverse direction control signals to control the inductive load driving circuit.

Since other structures and functions of the circuit shown in FIGS. 4A and 4B are the same as those of the circuit shown in FIGS. 1A and 1B, the description thereof is omitted for the sake of simplicity.

Referring to FIG. 5, an N-type diffusion layer 53-1 and an N-type diffusion layer 53-2 separated by a P-type isolation region 52 are formed in a P-type semiconductor substrate 51. A P⁺-type base region 54 is formed in the N-type diffusion layer 53-1, and an N⁺-type emitter region 55 is formed in the base region 54. Also, an N⁺-type collector region 56 is formed in the N-type diffusion layer 53-1. The emitter region 55 is connected to a ground potential point GND through an emitter terminal E. The base region 54 is connected to an external element through a base terminal B, and the collector region 56 is connected to an external element through a collector terminal C. The P-type isolation region 52 is connected to the ground potential point GND through an isolation terminal JI. With the structure described above, an NPN-type bipolar transistor is formed.

A guardring 57 of an N⁺-type semiconductor is formed in the N-type diffusion layer 53-2 around the P-type isolation region 52 between the NPN-type bipolar transistor and another device, in a manner that the guardring 57 encircles the NPN-type bipolar transistor. The guardring 57 is connected to an external element through a guardring terminal GR. In accordance with the present invention, the guardring terminal GR is connected to the ground potential point GND.

In the inductive load driving circuit of the third embodiment shown in FIG. 4A, the NPN-type bipolar transistors Q2 and Q3 are simultaneously driven, such that a load current Io in an inverse direction (indicated by a dot-and-dash line in the figure) flows through the load L. When the PWM control signal 42 is turned off, only the NPN-type bipolar transistor Q3 is turned on, and the other NPN-type bipolar transistors Q1, Q2 and Q4 turn off, as shown in FIG. 4B.

In this state, a load current circulates through a path formed by the load L, the collector and the emitter of the NPN-type bipolar transistor Q3 and a parasitic diode of the NPN-type bipolar transistor Q4 by an inductive electromotive force by the accumulated energy of the inductive load L, as indicated by a dot-and-dash line in FIG. 4B.

At this moment, in the integrated circuit shown in FIG. 5 in which the inductive load driving circuit is formed, an anode of the parasitic diode that corresponds to the P-type isolation region 52 is at the ground potential point GND, but a cathode of the parasitic diode that corresponds to the collector region 56 is drawn to a negative potential. As a result, a parasitic NPN-type bipolar transistor Tr is formed with the P-type isolation region 52 being as its base, the collector region 56 as its emitter, and an N-type region of another element as its collector.

In order to prevent malfunctions of the other circuits by the current of the parasitic NPN-type bipolar transistor Tr, the guardring 57 of an N-type semiconductor is provided around the P-type isolation region 52, such that the guardring functions as a collector of the parasitic NPN-type bipolar transistor Tr. The guardring terminal GR that externally leads the guardring 57 is connected to the ground potential point GND.

As a result, even when the parasitic NPN-type bipolar transistor Tr is formed in the load-driving NPN-type bipolar transistor Q4 (or the load-driving NPN-type bipolar transistor Q3), a voltage between the collector and the emitter of the parasitic NPN-type bipolar transistor Tr becomes very small compared with the conventional technique in which the guardring is connected to a power supply potential point Vcc.

Accordingly, the power loss is substantially reduced in a similar manner as the first embodiment and the second embodiment.

Figure 6A:
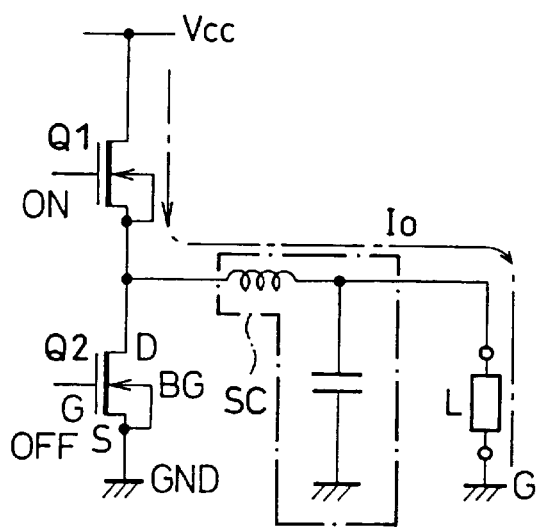
FIGS. 6A, 6B and 6C show an inductive load driving circuit in accordance with a fourth embodiment of the present invention.
Figure 6B:
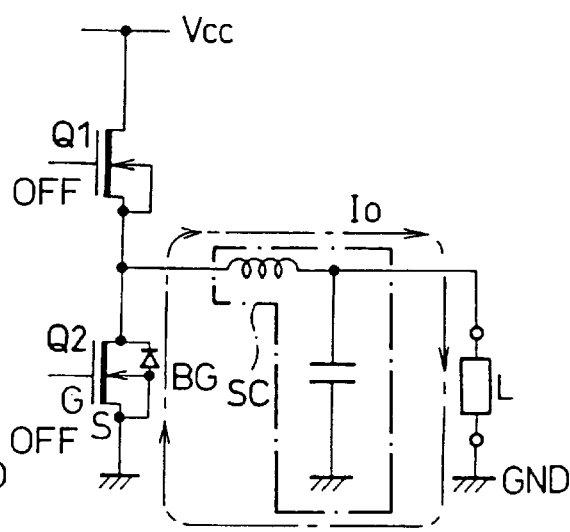
Figure 6C:
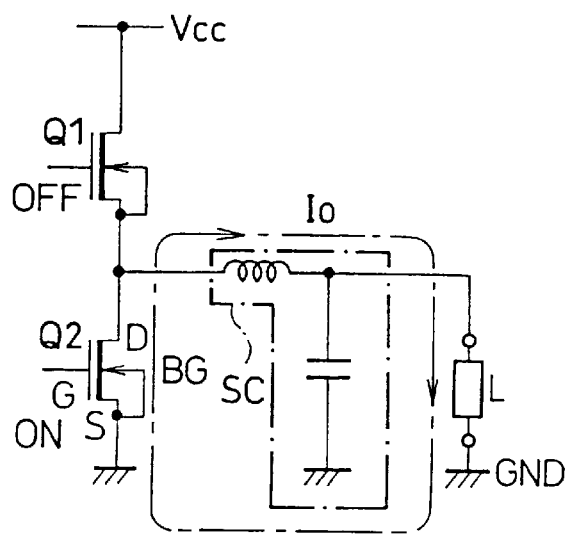

FIGS. 6A, 6B and 6C show an inductive load driving circuit in accordance with a fourth embodiment of the present invention.

In the inductive load driving circuit shown in FIGS. 6A, 6B and 6C, a load-driving MOSFETs Q1 and Q2 are connected between a power supply potential point Vcc and ground potential point GND. A load L is connected between a connection point between the load-driving MOSFETs Q1 and Q2 and the ground potential point GND. With the structure described above, a switching regulator is formed. A control circuit (not shown) provides a driving signal such as a PWM (pulse width modulation) control signal to control the inductive load driving circuit.

A smoothing circuit SC is composed of a reactor and a capacitor. The reactor is provided in the smoothing circuit SC in order to continuously flow a current through the load L, and the capacitor is provided in the smoothing circuit SC to smooth out the voltage. The load L functions as an inductive load together with the smoothing circuit SC. The load L is any kind of load.

Referring to FIGS. 6A through 6C, the MOSFETs Q1 and Q2 are N-channel type. MOSFETs shown in FIG. 2 and DMOSFETs shown in FIG. 3 may be used as the MOSFETs Q1 and Q2. Alternatively, NPN-type bipolar transistors shown in FIG. 5 may be used instead of MOSFETs.

FIG. 6A shows a state in which a power is supplied from a power supply to the load L. In this state, the MOSFET Q1 turns on, and the MOSFET Q2 turns off. In this power supply state, a load current Io flows from the power supply potential point Vcc through the MOSFET Q1 to the load L, as indicated by a dot-and-dash line in the figure.

The power supply state shown in FIG. 6A changes to a dead state in which both of the MOSFETs Q1 and Q2 turn off, as shown in FIG. 6B, and then to a power regeneration state in which the MOSFET Q1 turns off and the MOSFET Q2 turns on, as shown in FIG. 6C.

In the dead state shown in FIG. 6B, both of the MOSFETs Q1 and Q2 turn off, such that a through current is prevented from flowing between the power supply potential point Vcc and the ground potential point GND. Therefore, the inductive load driving circuit always goes through the dead state shown in FIG. 6B when the power supply state shown in FIG. 6A changes to the power regeneration state shown in FIG. 6C, and also when the power regeneration state of FIG. 6C changes to the power supply state of FIG. 6A.

In the state shown in FIG. 6B, a parasitic diode is formed between a back gate BG and a drain D of the MOSFET Q2. Also, in the state shown in FIG. 6C, a parasitic diode can be similarly formed when a voltage that is determined by the product of a on-resistance Ron of the MOSFET Q2 and a load current Io exceeds over a voltage level that turns on the parasitic diode.

In this embodiment, a parasitic NPN-type bipolar transistor Tr is formed by the parasitic diode in an integrated circuit in which the inductive load driving circuit is formed, in a similar manner as the first embodiment of FIG. 2, the second embodiment of FIG. 3 and the embodiment of FIG. 5. This embodiment is also provided with a guardring of an N-type semiconductor, and the guardring is connected to a ground potential. As a result, malfunctions of other elements are substantially reduced and the power loss caused by the parasitic NPN-type bipolar transistor Tr is substantially reduced. It is noted that, according to actual measurements conducted, the efficiency of the switching regulator of the present embodiment is improved from 89% of the conventional technique to 92%.

In the embodiments described above, the switching transistors use the same conductivity type. However, in the first, second and fourth embodiments, a switching transistor on the side of a power supply potential point Vcc may be formed with a P-channel type, and a switching transistor on the side of a ground potential point GND may be formed with an N-channel type. Similarly, in the third embodiment, a switching transistor at the side of a power supply potential point Vcc may be formed with a PNP-type, and a switching transistor on the side of a ground potential point GND may be formed with an NPN-type.

What we claim is:

1. An inductive load driving circuit formed in an integrated circuit device, the inductive load driving circuit comprising:

a first switching transistor connected between a first power supply potential point and an output terminal;

a second switching transistor connected between the output terminal and a second power supply potential point, wherein the first switching transistor and the second switching transistor are controllably turned on and off, to thereby supply an adjusted power to an inductive load that is connected between the output terminal and the second power supply potential point; wherein a guardring of an N-type semiconductor region is provided only for the second switching transistor, the guardring being connected to the second power supply potential point; wherein the second switching transistor is an N-channel MOSFET having a back gate region and a drain region where the N-channel MOSFET is formed in a P-type semiconductor substrate; wherein the back gate region is formed on the surface of the P-type semiconductor substrate; and wherein the back gate region is disposed between the drain region and the guardring.

2. The inductive circuit according to claim 1, wherein the back gate region is connected to the second power supply potential point.

3. An inductive load driving circuit formed in an integrated circuit device, the inductive load driving circuit comprising:

a first switching transistor connected between a first power supply potential point and an output terminal;

a second switching transistor connected between the output terminal and a second power supply potential point, wherein the first switching transistor and the second switching transistor are controllably turned on and off, to thereby supply an adjusted power to an inductive load that is connected between the output terminal and the second power supply potential point; wherein a guardring of an N-type semiconductor region is provided only for the second switching transistor, the guardring being connected to the second power supply potential point; wherein, the second switching transistor is an N-channel DMOSFET having a drain region where the N-channel DMOSFET is formed in an N-type diffusion layer provided in a P-type semiconductor substrate; and wherein, a P-type isolation region is disposed between the drain region and the guardring.

4. The inductive circuit according to claim 3, wherein the P-type isolation region is connected to the second power supply potential point.

5. An inductive load driving circuit formed in an integrated circuit device, the inductive load driving circuit comprising:

a first switching transistor connected between a first power supply potential point and an output terminal;

a second switching transistor connected between the output terminal and a second power supply potential point, wherein the first switching transistor and the second switching transistor are controllably turned on and off, to thereby supply an adjusted power to an inductive load that is connected between the output terminal and the second power supply potential point; wherein a guardring of an N-type semiconductor region is provided only for the second switching transistor, the guardring being connected to the second power supply potential point; wherein the second switching transistor is an NPN-type bipolar transistor formed in an N-type diffusion layer provided in a P-type semiconductor substrate; and wherein, a P-type isolation region is disposed between the collector of the NPN-type bipolar transistor and the guardring.

6. The inductive load circuit according to claim 5, wherein the P-type isolation region is connected to the second power supply potential point.

* * * * *